United States Patent
Lim et al.

(10) Patent No.: US 10,816,143 B2
(45) Date of Patent: Oct. 27, 2020

(54) ULTRAVIOLET LIGHT-EMITTING DEVICE AND LIGHTING SYSTEM

(71) Applicant: LG INNOTEK CO., LTD., Seoul (KR)

(72) Inventors: Hyun Chui Lim, Seoul (KR); Jae Woong Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 149 days.

(21) Appl. No.: 16/074,416

(22) PCT Filed: Jan. 26, 2017

(86) PCT No.: PCT/KR2017/000950
§ 371 (c)(1),
(2) Date: Jul. 31, 2018

(87) PCT Pub. No.: WO2017/135644
PCT Pub. Date: Aug. 10, 2017

(65) Prior Publication Data
US 2019/0032856 A1    Jan. 31, 2019

(30) Foreign Application Priority Data

Feb. 1, 2016  (KR) .................. 10-2016-0012249

(51) Int. Cl.
*F21K 9/20*     (2016.01)
*H01L 33/12*    (2010.01)
(Continued)

(52) U.S. Cl.
CPC .............. *F21K 9/20* (2016.08); *F21V 29/70* (2015.01); *H01L 33/00* (2013.01); *H01L 33/12* (2013.01);
(Continued)

(58) Field of Classification Search
None
See application file for complete search history.

(56) References Cited

U.S. PATENT DOCUMENTS

2001/0030317 A1    10/2001   Lee et al.
2011/0193057 A1*   8/2011    Sabathil ............... H01L 33/04
                                                          257/13
(Continued)

FOREIGN PATENT DOCUMENTS

JP    5284365       9/2013
JP    2014-107475   6/2014
(Continued)

OTHER PUBLICATIONS

English Translation, Moon et al., KR1020140073352, Korea, pp. 1-24 (Year: 2014).*
(Continued)

*Primary Examiner* — Shaun M Campbell
(74) *Attorney, Agent, or Firm* — KED & Associates LLP (57) ABSTRACT

An embodiment relates to an ultraviolet light-emitting diode, a method for manufacturing a light-emitting diode, a light-emitting diode package, and a lighting system. The light-emitting diode according to an embodiment includes: a second electrode layer (120); a second conductive type AlGaN-based semiconductor layer (119) on the second electrode layer (120); an active layer (117) on the second conductive type AlGaN-based semiconductor layer (119); a current spreading layer (115) including a first conductive type $Al_xGa_{1-x}N$ layer ($0<x\leq0.25$) (115c) and disposed on the active layer (117); and a first conductive type AlGaN-based semiconductor layer (114) disposed on the current spreading layer (115). A composition x of Al in the first conductive type $Al_xGa_{1-x}N$ layer ($0<x\leq0.25$) (115c) may be reduced in a direction of the active layer (117) from the first conductive type first AlGaN-based semiconductor layer (114).

13 Claims, 8 Drawing Sheets

(51) Int. Cl.
　　　H01L 33/36　　(2010.01)
　　　H01L 33/00　　(2010.01)
　　　H01L 33/22　　(2010.01)
　　　H01L 33/14　　(2010.01)
　　　H01L 33/32　　(2010.01)
　　　F21V 29/70　　(2015.01)
　　　F21Y 115/10　　(2016.01)

(52) U.S. Cl.
　　　CPC .............. H01L 33/14 (2013.01); H01L 33/22 (2013.01); H01L 33/325 (2013.01); H01L 33/36 (2013.01); *F21Y 2115/10* (2016.08)

(56) References Cited

U.S. PATENT DOCUMENTS

2012/0119254 A1* 5/2012 Moon .................... H01L 33/22
　　　　　　　　　　　　　　　　　　　　　　　　257/101
2014/0162386 A1* 6/2014 Huang .................... H01L 33/22
　　　　　　　　　　　　　　　　　　　　　　　　438/29
2017/0330995 A1* 11/2017 Obata .................... H01L 33/007

FOREIGN PATENT DOCUMENTS

| KR | 10-2001-0077971 | | 8/2001 | |
| KR | 10-2013-0032201 | | 4/2013 | |
| KR | 1020140073352 | * | 6/2014 | ............ H01L 33/02 |
| KR | 10-2015-0089816 | | 8/2015 | |

OTHER PUBLICATIONS

International Search Report (with English Translation) and Written Opinion dated May 17, 2017 issued in Application No. PCT/KR2017/000950.

* cited by examiner

ULTRAVIOLET LIGHT-EMITTING DEVICE AND LIGHTING SYSTEM

CROSS-REFERENCE TO RELATED PATENT APPLICATIONS

This application is a U.S. National Stage Application under 35 U.S.C. § 371 of PCT Application No. PCT/KR2017/000950, filed Jan. 26, 2017, which claims priority to Korean Patent Application No. 10-2016-0012249, filed Feb. 1, 2016, whose entire disclosures are hereby incorporated by reference.

TECHNICAL FIELD

An embodiment relates to an ultraviolet light-emitting diode, a method for manufacturing a light-emitting diode, a light-emitting diode package, and a lighting system.

BACKGROUND ART

A light-emitting diode (LED) is a p-n junction diode having a characteristic in which electric energy is converted into light energy, and may be formed by compounding Group III-V elements or Group II-VI elements on the periodic table, and may represent various colors by adjusting a composition ratio of a compound semiconductor.

For example, a nitride semiconductor has received a great interest in a development field of an optical device and a high-power electronic device due to high thermal stability and wide band gap energy thereof. In particular, an ultraviolet (UV) LED, a blue LED, a green LED, a red LED, and the like using the nitride semiconductor are commercialized and used widely.

For example, the UV LED is a light-emitting diode that emits light distributed in a wavelength band of 200 to 400 nm, in the wavelength band, a short wavelength may be used for sterilization, purification, or the like, and a long wavelength may be used in a exposure apparatus or a curing apparatus, or the like.

For example, a near UV LED is used for a counterfeit detection, a resin curing, or an ultraviolet ray treatment, etc., and is also used in a lighting system implementing visible rays of various colors by combining with a phosphor.

Meanwhile, the UV LED has a problem that light-receiving efficiency and light output are deteriorated as compared with the blue LED. This serves as a barrier to practical use of the UV LED.

For example, Group III nitrides used in the UV LED may be widely used from visible rays to ultraviolet rays, but there is a problem that efficiency of the ultraviolet rays are deteriorated as compared with that of the visible rays. The reason is that Group III nitrides absorb the ultraviolet rays as toward the wavelength of the ultraviolet rays and internal quantum efficiency is deteriorated due to low crystallinity.

Accordingly, according to the related art, in order to prevent absorption of the ultraviolet rays in Group III nitrides, after growing a growth substrate, a GaN layer, an AlGaN layer, an active layer, and the like in order, the GaN layer which may absorb the ultraviolet rays is removed and the AlGaN layer is exposed, but it is difficult to solve a problem that internal quantum efficiency is deteriorated due to low crystallinity of the AlGaN layer.

For example, according to the related art, when an AlGaN layer is grown in the GaN layer, a tensile stress is generated in the AlGaN layer due to a difference in mutual lattice constant or the like, and cracks are generated, so that a leakage current is generated and light output Po is lowered, and there is a difference in lattice constant between the lower AlGaN layer and the active layer to be formed later, and strain is generated in a quantum well due to a difference in lattice constant, so that internal light-emitting efficiency is deteriorated due to deterioration of crystal quality.

Meanwhile, an AlGaN layer is required in order to manufacture the UV LED, and since doping concentration of an n-type dopant is higher in the AlGaN layer than in the GaN layer, the AlGaN layer is required, but as the AlGaN layer occupies a larger portion, there is a technical contradiction in which the crystal quality deteriorates due to a difference in lattice constant and internal light-emitting efficiency is deteriorated.

In addition, according to the related art, since mobility of electrons injected from an n-type semiconductor layer is high, an overflow occurs without bonding with a hole in a light-emitting layer, and light-emitting recombination efficiency is deteriorated, so that internal light-emitting efficiency is low.

Meanwhile, in the related art, there is an attempt to solve the problem of the overflow of electrons, but since a difference in lattice constant between additional layers and an active layer occurs, there are problems that crystal quality is deteriorated and entire internal light-emitting efficiency is rather deteriorated.

In addition, in order to improve light output Po in the LED, uniform current injection efficiency is important according to current spreading, but in the related art, when an n-type electrode is disposed only in a part, there is a problem that uniform current injection is not performed due to current crowding and light output is deteriorated. In the related art, although current spreading is attempted by improving an electrode structure, there is a technical contradiction that as an electrode occupies a larger region, light extraction efficiency is deteriorated due to absorption of photons or the like at the electrode.

DISCLOSURE

Technical Problem

An embodiment is directed to providing an ultraviolet light-emitting diode in which deterioration of crystal quality due to a difference in lattice constant is not caused, even though an AlGaN layer is provided, and thus light-emitting efficiency is improved, a method of manufacturing a light-emitting diode, a light-emitting diode package, and a lighting system.

An embodiment is directed to providing an ultraviolet light-emitting diode in which internal light-emitting efficiency is remarkably improved by solving a problem of electron overflow and simultaneously minimizing a difference in lattice constant with an active layer, a method of manufacturing a light-emitting diode, a light-emitting diode package, and a lighting system.

In addition, an embodiment is directed to providing an ultraviolet light-emitting diode in which current injection efficiency due to current spreading is improved while maintaining external light extraction efficiency by adopting a conventional electrode structure, and thus light output Po is remarkably improved, a method of manufacturing a light-emitting diode, a light-emitting diode package, and a lighting system.

Technical Solution

A light-emitting diode according to an embodiment includes: a second electrode layer (120); a second conductive type AlGaN-based semiconductor layer (119) on the second electrode layer (120); an active layer (117) on the second conductive type AlGaN-based semiconductor layer (119); a current spreading layer (115) including a first conductive type AlxGa1-xN layer (0<x≤0.25) (115c) and disposed on the active layer (117); and a first conductive type AlGaN-based semiconductor layer (114) disposed on the current spreading layer (115).

A composition x of Al in the first conductive type AlxGa1-xN layer (0<x≤0.25) (115c) may be reduced in a direction of the active layer (117) from the first conductive type first AlGaN-based semiconductor layer (114).

A lighting system according to an embodiment may include a light-emitting unit having the light-emitting diode.

Advantageous Effects

An embodiment may provide an ultraviolet light-emitting diode in which deterioration of crystal quality due to a difference in lattice constant is not caused even though an AlGaN layer is provided, and thus a high concentration of an n-type dopant is ensured and internal light-emitting efficiency is improved, a method of manufacturing a light-emitting diode, a light-emitting diode package, and a lighting system.

An embodiment may provide an ultraviolet light-emitting diode in which internal light-emitting efficiency is remarkably improved by solving a problem of electron overflow and simultaneously minimizing a difference in lattice constant with an active layer, a method of manufacturing a light-emitting diode, a light-emitting diode package, and a lighting system.

In addition, an embodiment may provide an ultraviolet light-emitting diode in which current injection efficiency due to current spreading is improved while maintaining external light extraction efficiency by adopting a conventional electrode structure, and thus light output Po is remarkably improved, a method of manufacturing a light-emitting diode, a light-emitting diode package, and a lighting system.

DESCRIPTION OF DRAWINGS

FIGS. 4A to 7 are process cross-sectional views illustrating a method of manufacturing a light-emitting diode according to an embodiment.

MODES OF THE INVENTION

In the description of embodiments, it will be understood that when a layer (or film), region, pattern or structure is referred to as being "on/over" or "under" another layer (or film), region, pattern or structure, the terminologies of "on/over" and "under" include both the meanings of "directly" and "by interposing another layer (indirectly)". Further, the reference with respect to on/over" or "under" each layer will be made on the basis of drawings, but is not limited thereto.

Embodiment

Figure 1:
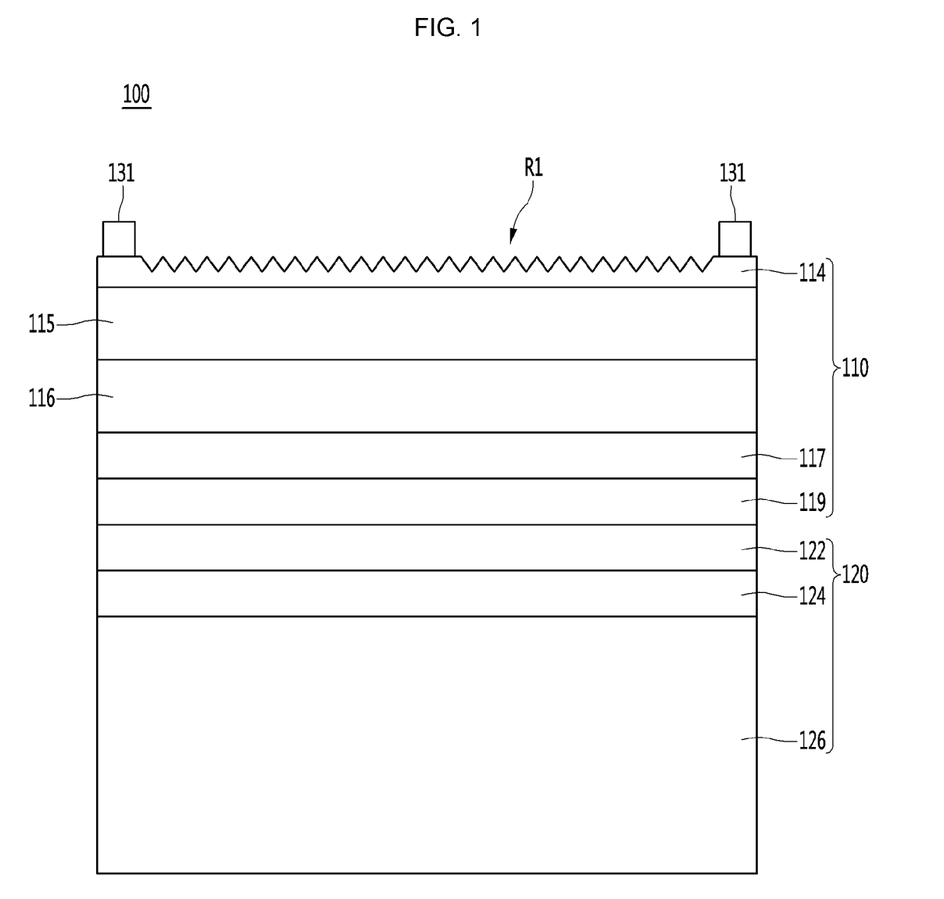
FIG. 1 is a cross-sectional view of an ultraviolet light-emitting diode according to an embodiment.

FIG. 1 a cross-sectional view of an ultraviolet light-emitting diode 100 according to an embodiment.

The ultraviolet light-emitting diode 100 according to the embodiment may include a second electrode layer 120, a light-emitting structure layer 110, an InAlGaN-based strain relieving layer 116, a current spreading layer 115, and a first electrode 131. The ultraviolet light-emitting diode 100 may include a blue color, for example, with a wavelength of 440 to 485 nm.

For example, the light-emitting diode 100 according to the embodiment may include a second electrode layer 120, a second conductive type AlGaN-based semiconductor layer 119 on the second electrode layer 120, an active layer 117 on the second conductive type AlGaN-based semiconductor layer 119, a current spreading layer 115 including a first conductive type AlxGa1-xN layer (0<x≤0.25) 115c and disposed on the active layer 117, and a first conductive type AlGaN-based semiconductor layer 114 disposed on the current spreading layer 115. The light-emitting structure layer 110 may include the first conductive type AlGaN-based semiconductor layer 114, the active layer 117, and the second conductive type AlGaN-based semiconductor layer 119, but is not limited thereto.

Figure 2:
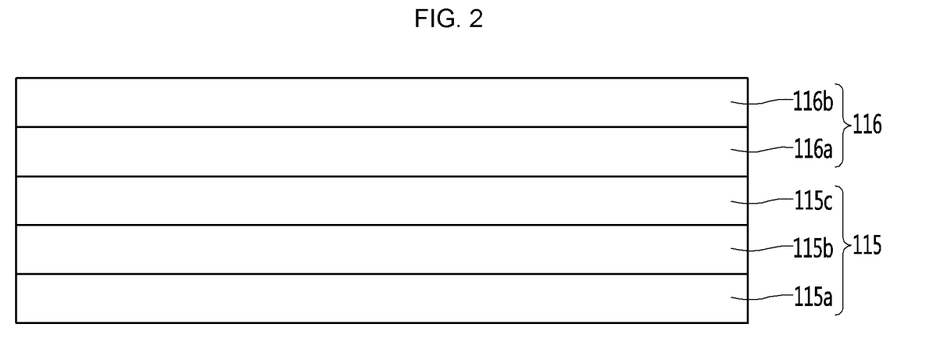
FIG. 2 is a partially enlarged view of an ultraviolet light-emitting diode according to an embodiment.

FIG. 2 is a partially enlarged view of a light-emitting diode according to an embodiment.

In the embodiment, the current spreading layer 115 may include a Ga-based layer 115a, an Al-based layer 115b on the Ga-based layer 115a, and the first conductive type AlxGa1-xN layer (0<x≤0.25) 115c on the Al-based layer 115b. The current spreading layer 115 may be formed at a predetermined cycle with one pair of the Ga-based layer 115a/Al-based layer 115b/first conductive type AlxGa1-xN layer (0<x≤0.25) 115c. For example, the current spreading layer 115 may be formed at about two cycles or more with one pair of the Ga-based layer 115a/Al-based layer 115b/first conductive type AlxGa1-xN layer (0<x≤0.25) 115c, but is not limited thereto. The Ga-based layer 115a may include a GaN layer, an InGaN layer, or the like, but is not limited thereto. The Al-based layer 115b may include an AlN layer, an AlGaN layer, or the like, but is not limited thereto.

The Ga-based layer 115a may be formed with a thickness of 1 to 20 nm, and when the thickness is more than 20 nm, a problem that resistance thereof increases may occur. The Al-based layer 115b may be formed with a thickness of 1 to 3 nm, and when the thickness is more than 3 nm, crystal quality may be deteriorated. The first conductive type AlxGa1-xN layer (0<x≤0.25) 115c may be formed with a thickness of 1 to 20 nm, and when the thickness is more than 20 nm, a problem that resistance thereof increases may occur.

In addition, an embodiment may include an InAlGaN-based strain relieving layer 116 between the current spreading layer 115 and the active layer 117. The InAlGaN-based strain relieving layer 116 may include an InGaN-based semiconductor layer 116a disposed on the current spreading layer 115 and an AlGaN-based semiconductor layer 116b disposed on the InGaN-based semiconductor layer 116a. The InGaN-based semiconductor layer 116a may include an InGaN layer, an InAlGaN layer, or the like, but is not limited thereto. The AlGaN-based semiconductor layer 116b may include an AlGaN layer, an InAlGaN layer, a GaN layer, or the like, but is not limited thereto.

The InAlGaN-based strain relieving layer 116 may be formed at a predetermined cycle, for example five cycles or more with one pair of the InGaN-based semiconductor layer 116a/AlGaN-based semiconductor layer 116b, but is not limited thereto.

The InGaN-based semiconductor layer 116a or the AlGaN-based semiconductor layer 116b may be formed with a thickness of about 1 to about 10 nm, respectively, and when the thickness is more than 10 nm, a problem that resistance thereof increases may occur. Hereinafter, the technical features of the ultraviolet light-emitting diode according to the embodiment will be described with reference to FIGS. 1 and 2.

First, a technical problem of the ultraviolet light-emitting diode according to the embodiment is directed to providing an ultraviolet light-emitting diode in which light-emitting efficiency is improved by not causing a deterioration of crystal quality even though an AlGaN layer is provided.

According to the related art, when an AlGaN layer is grown in a GaN layer, a tensile stress is generated in the AlGaN layer due to a difference in mutual lattice constant or the like, and cracks are generated, so that a leakage current is generated and light output Po is lowered, and there is a difference in lattice constant between the lower AlGaN layer and an active layer to be formed later, and strain is generated in a quantum well due to a difference in lattice constant, so that internal light-emitting efficiency is deteriorated due to deterioration of crystal quality.

Meanwhile, an AlGaN layer is required in order to manufacture the ultraviolet light-emitting diode, and since doping concentration of an n-type dopant is higher in the AlGaN layer than in the GaN layer, the AlGaN layer is required. However, as the AlGaN layer occupies a larger portion, there is a technical contradiction in which crystal quality deteriorates due to a difference in lattice constant and internal light-emitting efficiency is deteriorated.

In order to solve such a technical contradiction, the ultraviolet light-emitting diode 100 according to the embodiment may be provided such that a current spreading layer 115 including a first conductive type $Al_xGa_{1-x}N$ layer ($0<x\leq0.25$) 115c is disposed between the first conductive type AlGaN-based semiconductor layer 114 and the active layer 117.

In addition, in an embodiment, a composition x of Al in the first conductive type $Al_xGa_{1-x}N$ layer ($0<x\leq0.25$) 115c may be reduced in a direction of the active layer 117 from the first conductive type AlGaN-based semiconductor layer 114. For example, the composition x of Al in the first conductive type $Al_xGa_{1-x}N$ layer ($0<x\leq0.25$) 115c may be reduced stepwise or continuously in the direction of the active layer 117 from the first conductive type AlGaN-based semiconductor layer 114.

In the related art, it was difficult to dispose a current spreading layer containing Al so as to be adjacent to an active layer. This is because lattice defects of the active layer are generated because a difference in crystal lattice constant between indium (In) which is a main component of the active layer and aluminum (Al) is large.

An n-type dopant with a high concentration may be injected into the first conductive type $Al_xGa_{1-x}N$ layer ($0<x\leq0.25$) 115c. For example, in an embodiment, an n-type dopant of about $5\times10^{17}$ to $3\times10^{19}$ (atoms/cm3) may be injected into the first conductive type $Al_xGa_{1-x}N$ layer ($0<x\leq0.25$) 115c. For example, in an embodiment, an n-type dopant with high concentration of about $2\times10^{19}$ to $3\times10^{19}$ (atoms/cm3) may be injected into the first conductive type $Al_xGa_{1-x}N$ layer ($0<x\leq0.25$) 115c.

On the other hand, in the related art, when an n-type dopant with a concentration of about $1\times10^{19}$ (atoms/cm3) is injected into the current spreading layer, there is a problem that cracks occur, so that it is difficult to inject a dopant with a higher concentration than that.

According to the embodiment, there is provided an ultraviolet light-emitting diode in which deterioration of crystal quality due to a difference in lattice constant with the active layer 117 may not occur and simultaneously, a high concentration of n-type dopant is ensured and internal light-emitting efficiency is improved even though the current spreading layer 115 including the first conductive type $Al_xGa_{1-x}N$ layer ($0<x\leq0.25$) 115c is disposed to be adjacent to the active layer 117 by disposing the first conductive type $Al_xGa_{1-x}N$ layer ($0<x\leq0.25$) 115c in which a composition x of Al is reduced in a direction of the active layer 117 from the first conductive type AlGaN-based semiconductor layer 114 between the first conductive type AlGaN-based semiconductor layer 114 and the active layer 117.

A technical problem of another embodiment is directed to providing an ultraviolet light-emitting diode in which internal light-emitting efficiency is remarkably improved by solving an overflow problem of electrons and simultaneously minimizing a difference in lattice constant with the active layer.

In order to solve such a technical problem, an embodiment may provide an ultraviolet light-emitting diode in which deterioration of crystal quality due to a difference in lattice constant with the active layer 117 may not occur and simultaneously internal light-emitting efficiency is remarkably improved by simultaneously solving an overflow problem of electrons by a cooling effect of the electrons in the current spreading layer 115 including the first conductive type $Al_xGa_{1-x}N$ layer ($0<x\leq0.25$) 115c, even though the current spreading layer 115 including the first conductive type $Al_xGa_{1-x}N$ layer ($0<x\leq0.25$) 115c is disposed to be adjacent to the active layer 117 by disposing the current spreading layer 115 including the first conductive type $Al_xGa_{1-x}N$ layer ($0<x\leq0.25$) 115c in which a composition x of Al is reduced in a direction of the active layer 117 from the first conductive type AlGaN-based semiconductor layer 114 between the first conductive type AlGaN-based semiconductor layer 114 and the active layer 117.

In addition, still another technical problem of an ultraviolet light-emitting diode according to an embodiment is directed to providing an ultraviolet light-emitting diode in which current injection efficiency due to current spreading is improved while maintaining external light extraction efficiency by adopting a conventional electrode structure, and thus light output Po is remarkably improved.

In order to solve the technical problem, an embodiment may provide an ultraviolet light-emitting diode in which the current injection efficiency due to the current spreading is improved while maintaining the external light extraction efficiency by adopting the conventional electrode structure and thus light output Po is remarkably improved by a current spreading effect in the current spreading layer 115 including the first conductive type $Al_xGa_{1-x}N$ layer ($0<x\leq0.25$) 115c by disposing the current spreading layer 115 including the first conductive type $Al_xGa_{1-x}N$ layer ($0<x\leq0.25$) 115c in which a composition x of Al is reduced in a direction of the active layer 117 from the first conductive type AlGaN-based semiconductor layer 114 between the first conductive type AlGaN-based semiconductor layer 114 and the active layer 117.

Figure 3:
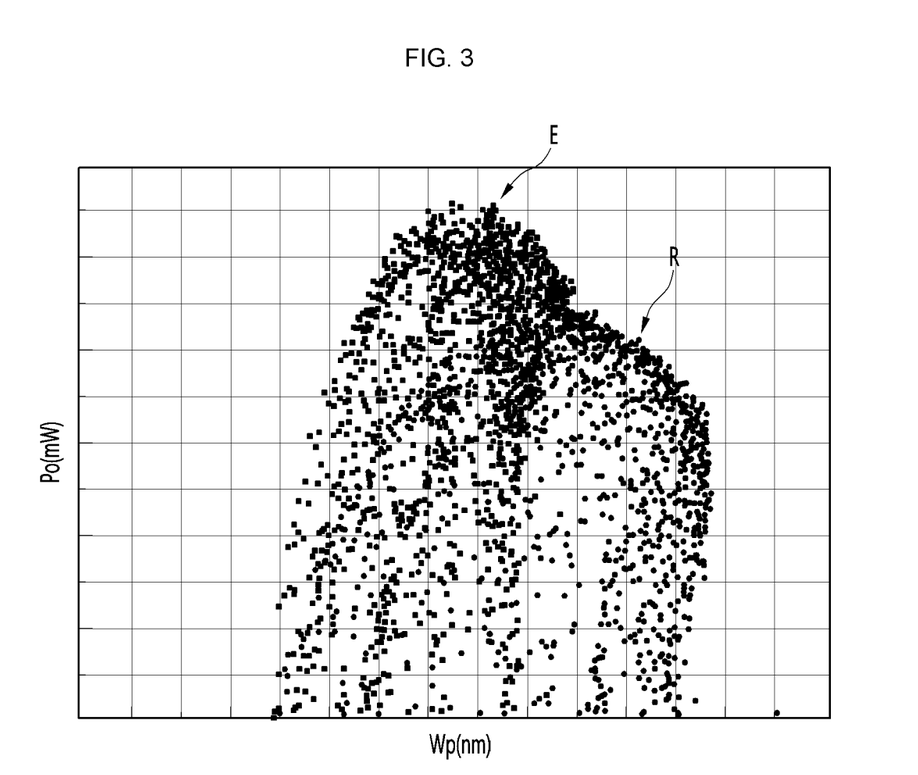
FIG. 3 is data of light output Po of a light-emitting diode according to an embodiment and a comparative example.

FIG. 3 is data of luminous intensity Po of a light-emitting diode according to an embodiment and a comparative example.

For example, luminous intensity E of the light-emitting diode according to the embodiment is remarkably improved as compared with luminous intensity R of the comparative example. For example, luminous intensity E of the light-emitting diode according to the embodiment is remarkably improved as compared with luminous intensity R of the comparative example. For example, the luminous intensity of the light-emitting diode is improved by about 10 mW or more as compared with the luminous intensity of the comparative example.

An experimental example according to the embodiment is a light-emitting diode in which the current spreading layer 115 is formed at three cycles with one pair of the Ga-based layer 115a/Al-based layer 115b/first conductive type $Al_xGa_{1-x}N$ layer ($0<x\leq0.25$) 115c.

The comparative example is a light-emitting diode not provided with the current spreading layer 115 including the first conductive type $Al_xGa_{1-x}N$ layer ($0<x\leq0.25$) 115c, unlike the embodiment.

In addition, in the embodiment, a surface resistance was remarkably improved by an electron spreading effect as compared with the comparative example. For example, the surface resistance of the ultraviolet light-emitting diode according to the embodiment is about 8.3Ω/□, which is much improved as compared with about 8.0Ω/□ of the comparative example.

In the light-emitting diode according to the embodiment, the InAlGaN-based strain relieving layer 116 may be organically bonded between the current spreading layer 115 including the first conductive type $Al_xGa_{1-x}N$ layer ($0<x\leq0.25$) 115c and the active layer 117, and a strain in the active layer 117 may be relieved more complexly, and thus internal light-emitting efficiency may be remarkably increased.

Hereinafter, a method of manufacturing an ultraviolet light-emitting diode according to an embodiment will be described with reference to FIGS. 4A to 7, and the method of manufacturing of the embodiment is not limited to a following description.

Figure 4A:
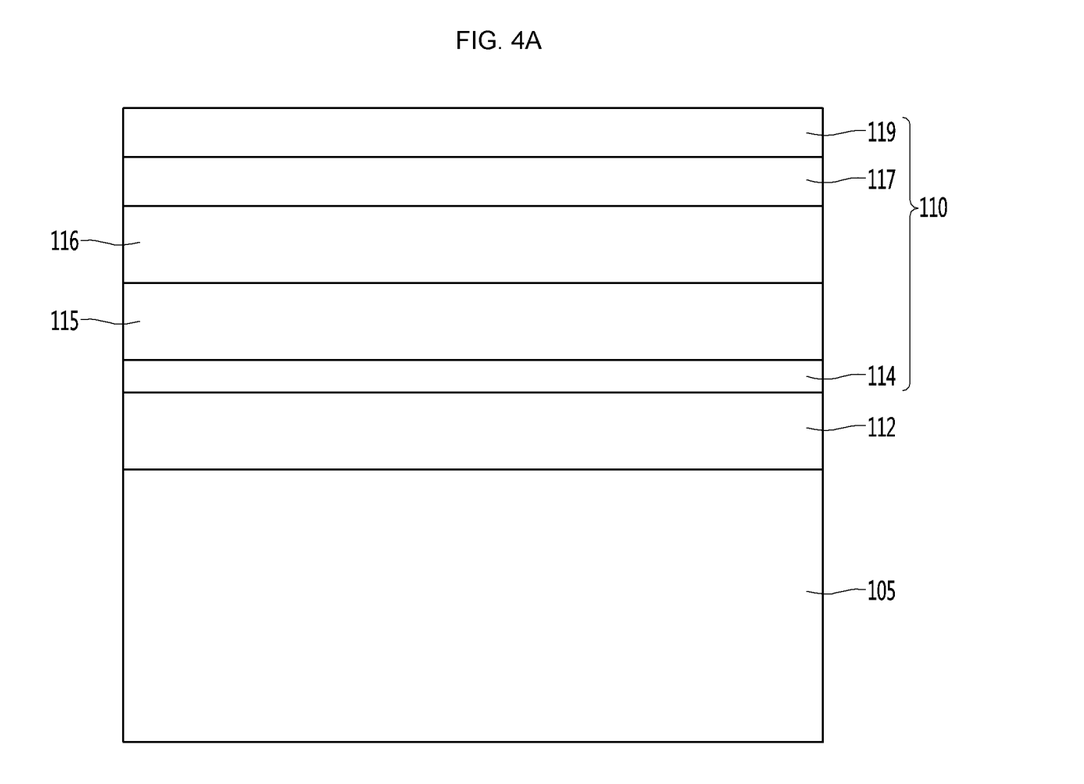

First, a substrate 105 is provided as shown in FIG. 4A. The substrate 105 may be formed of a material having excellent thermal conductivity, and may be a conductive substrate or an insulating substrate, and may be formed as a single layer or multiple layers.

For example, the substrate 105 may use at least one of sapphire (Al2O3), SiC, Si, GaAs, GaN, ZnO, GaP, InP, Ge, and Ga2O3. A concave-convex structure may be formed on the substrate 105, but is not limited thereto.

A buffer layer (not shown) may be formed on the substrate 105. The buffer layer may relieve a lattice mismatch between a material of a light-emitting structure layer 110 formed later and the substrate 105, and a material of the buffer layer may be formed of a Group III-V or Group II-VI compound semiconductor, as an example, at least one of GaN, InN, AlN, InGaN, AlGaN, InAlGaN, and AlInN and may be formed as a single layer or multiple layers.

Then, a first conductive type semiconductor layer 112 may be formed on the first substrate 105. For example, the first conductive type semiconductor layer 112 may be implemented as a compound semiconductor such as Group III-V, Group II-VI, or the like and a first conductive type dopant may be doped thereon, and may be formed as a single layer or multiple layers.

When the first conductive type semiconductor layer 112 is an n-type semiconductor layer, the first conductive type dopant may include Si, Ge, Sn, Se, or Te as an n-type dopant, but is not limited thereto.

The first conductive type semiconductor layer 112 may be a GaN-based semiconductor layer, and may include a semiconductor material having an empirical formula of $In_xAl_yGa_{1-x-y}N$ ($0\leq x\leq 1$, $0\leq y\leq 1$, $0\leq x+y\leq 1$). For example, the first conductive type semiconductor layer 112 may be formed of any one or more of GaN, InN, AlN, InGaN, AlGaN, InAlGaN, AlInN, AlGaAs, InGaAs, AlInGaAs, GaP, AlGaP, InGaP, AlInGaP, and InP.

Then, a first conductive type AlGaN-based semiconductor layer 114 may be formed on the first conductive type semiconductor layer 112.

The first conductive type AlGaN-based semiconductor layer 114 may have a composition of $Al_{x1}Ga_{1-x1}N$ (where, $0\leq x\leq 1\leq 1$), and may be formed as a single layer or multiple layers.

For example, in an embodiment, the first conductive type AlGaN-based semiconductor layer 114 may have a composition of $Al_{x1}Ga_{1-x1}N$ (where, $0\leq x1\leq 1$). At this point, in the embodiment, a composition x1 of Al in the first conductive type AlGaN-based semiconductor layer 114 may be 3% to 8%, but is not limited thereto. When the composition of Al is less than about 3%, there is a problem that light output is deteriorated by absorbing light emitted from an active layer 117. When the composition of Al is more than about 8%, a crack may occur due to a difference in lattice constant.

Figure 4B:
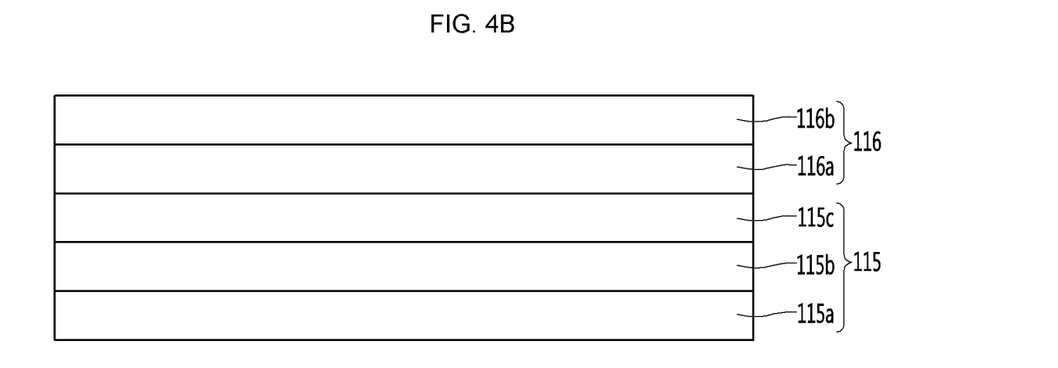

Then, in an embodiment, a current spreading layer 115 and an InAlGaN-based strain relieving layer 116 may be formed on the first conductive type AlGaN-based semiconductor layer 114, which will be described with reference to FIG. 4B.

In the embodiment, the current spreading layer 115 may include a Ga-based layer 115a, an Al-based layer 115b on the Ga-based layer 115a, and the first conductive type $Al_xGa_{1-x}N$ layer ($0<x\leq0.25$) 115c on the Al-based layer 115b.

The current spreading layer 115 may be formed at a predetermined cycle with one pair of the Ga-based layer 115a/Al-based layer 115b/first conductive type $Al_xGa_{1-x}N$ layer ($0<x\leq0.25$) 115c. For example, the current spreading layer 115 may be formed at about two cycles or more with one pair of the Ga-based layer 115a/Al-based layer 115b/ first conductive type $Al_xGa_{1-x}N$ layer ($0<x\leq0.25$) 115c, but is not limited thereto. The Ga-based layer 115a may include a GaN layer, an InGaN layer, or the like, but is not limited thereto. The Al-based layer 115b may include an AlN layer, an AlGaN layer, or the like, but is not limited thereto.

The Ga-based layer 115a may be formed with a thickness of 1 to 20 nm, and when the thickness is more than 20 nm, a problem that resistance is increased may occur. The Al-based layer 115b may be formed with a thickness of 1 to 3 nm, and when the thickness is more than 3 nm, crystal quality may be deteriorated. The first conductive type $Al_xGa_{1-x}N$ layer ($0<x\leq0.25$) 115c may be formed with a thickness of 1 to 20 nm, and when the thickness is more than 20 nm, a problem that resistance is increased may occur.

The first conductive type AlGaN-based semiconductor layer 114 may be formed with a thickness of about 1 to 20 nm. When the thickness of the first conductive type AlGaN-based semiconductor layer 114 is more than 20 nm, a problem of light absorption may occur. The first conductive type AlGaN-based semiconductor layer 114 may be formed with a thick layer having a thickness of about 20 nm and an n-type dopant with a high concentration may be injected, and thus light-emitting efficiency according to high carrier injection efficiency may be increased.

The ultraviolet light-emitting diode 100 according to the embodiment may dispose the current spreading layer 115 including the first conductive type AlxGa1-xN layer (0<x≤0.25) 115c between the first conductive type first AlGaN-based semiconductor layer 114 and the active layer 117.

In addition, in the embodiment, a composition x of Al in the first conductive type AlxGa1-xN layer (0<x≤0.25) 115c may be reduced in a direction of the active layer 117 from the first conductive type first AlGaN-based semiconductor layer 114. For example, the composition x of Al in the first conductive type AlxGa1-xN layer (0<x≤0.25) 115c may be reduced stepwise or continuously in the direction of the active layer 117 from the first conductive type first AlGaN-based semiconductor layer 114.

An n-type dopant with a high concentration may be injected into the first conductive type AlxGa1-xN layer (0<x≤0.25) 115c. For example, in the embodiment, an n-type dopant of about $5\times10^{17}$ to $3\times10^{19}$ (atoms/cm3) may be injected into the first conductive type AlxGa1-xN layer (0<x≤0.25) 115c. For example, in the embodiment, an n-type dopant with a high concentration of about $2\times10^{19}$ to $3\times10^{19}$ (atoms/cm3) may be injected into the first conductive type AlxGa1-xN layer (0<x≤0.25) 115c.

On the other hand, in the related art, when an n-type dopant with a concentration of about $1\times10^{19}$ (atoms/cm3) is injected into the current spreading layer, there is a problem that cracks occur, so that it is difficult to inject a dopant with a higher concentration than that.

According to an embodiment, there is provided an ultraviolet light-emitting diode in which deterioration of crystal quality due to a difference in lattice constant with the active layer 117 may not occur and simultaneously, a high concentration of n-type dopant is ensured and internal light-emitting efficiency is improved even though the current spreading layer 115 including the first conductive type AlxGa1-xN layer (0<x≤0.25) 115c is disposed to be adjacent to the active layer 117 by disposing the first conductive type AlxGa1-xN layer (0<x≤0.25) 115c in which a composition x of Al is reduced in a direction of the active layer 117 from the first conductive type first AlGaN-based semiconductor layer 114 between the first conductive type first AlGaN-based semiconductor layer 114 and the active layer 117.

In addition, an embodiment may provide an ultraviolet light-emitting diode in which deterioration of crystal quality due to a difference in lattice constant with the active layer 117 may not occur and simultaneously internal light-emitting efficiency is remarkably improved by simultaneously solving an overflow problem of electrons by a cooling effect of the electrons in the current spreading layer 115 including the first conductive type AlxGa1-xN layer (0<x≤0.25) 115c, even though the current spreading layer 115 including the first conductive type AlxGa1-xN layer (0<x≤0.25) 115c is disposed to be adjacent to the active layer 117 by disposing the current spreading layer 115 including the first conductive type AlxGa1-xN layer (0<x≤0.25) 115c in which a composition x of Al is reduced in a direction of the active layer 117 from the first conductive type first AlGaN-based semiconductor layer 114 between the first conductive type first AlGaN-based semiconductor layer 114 and the active layer 117.

Further, an embodiment may provide an ultraviolet light-emitting diode in which current injection efficiency due to current spreading is improved while maintaining external light extraction efficiency by adopting a conventional electrode structure and thus light output Po is remarkably improved by a current spreading effect in the current spreading layer 115 including the first conductive type AlxGa1-xN layer (0<x≤0.25) 115c by disposing the current spreading layer 115 including the first conductive type AlxGa1-xN layer (0<x≤0.25) 115c in which a composition x of Al is reduced in a direction of the active layer 117 from the first conductive type first AlGaN-based semiconductor layer 114 between the first conductive type first AlGaN-based semiconductor layer 114 and the active layer 117.

Then, the InAlGaN-based strain relieving layer 116 may include an InGaN-based semiconductor layer 116a on the current spreading layer 115 and an AlGaN-based semiconductor layer 116b on the InGaN-based semiconductor layer 116a. The InGaN-based semiconductor layer 116a may not be intentionally doped with an n-type dopant, the AlGaN-based semiconductor layer 116b may be doped with an n-type dopant, and the AlGaN-based semiconductor layer 116b may not include Al, but is not limited thereto. For example, when the AlGaN-based semiconductor layer 116b is doped with an n-type dopant, an n-type dopant with a concentration of about $5\times10^{17}$ to $1\times10^{19}$ (atoms/cm3) may be provided, and thus current injection efficiency may be increased. When the doping concentration of the AlGaN-based semiconductor layer 116b is less than $5\times10^{17}$ (atoms/cm3), contribution to current injection efficiency may not be large, and when the doping concentration of the AlGaN-based semiconductor layer 116b is more than $1\times10^{19}$ (atoms/cm3), electronic overflow may occur.

The InGaN-based semiconductor layer 116a may include an InGaN layer, an InAlGaN layer, or the like, but is not limited thereto. The AlGaN-based semiconductor layer 116b may include an AlGaN layer, an InAlGaN layer, a GaN layer, or the like, but is not limited thereto.

The InAlGaN-based strain relieving layer 116 may be formed at a predetermined cycle, for example five cycles or more with one pair of the InGaN-based semiconductor layer 116a/AlGaN-based semiconductor layers 116b, but is not limited thereto.

The InGaN-based semiconductor layer 116a or the AlGaN-based semiconductor layer 116b may be formed with a thickness of about 1 to about 10 nm, respectively, and when the thickness is more than 10 nm, a problem that resistance is increased may occur.

In the light-emitting diode according to the embodiment, the InAlGaN-based strain relieving layer 116 may be organically bonded between the current spreading layer 115 including the first conductive type AlxGa1-xN layer (0<x≤0.25) 115c and the active layer 117, and a strain in the active layer 117 may be relieved more complexly, and thus internal light-emitting efficiency may be remarkably increased.

Figure 5:
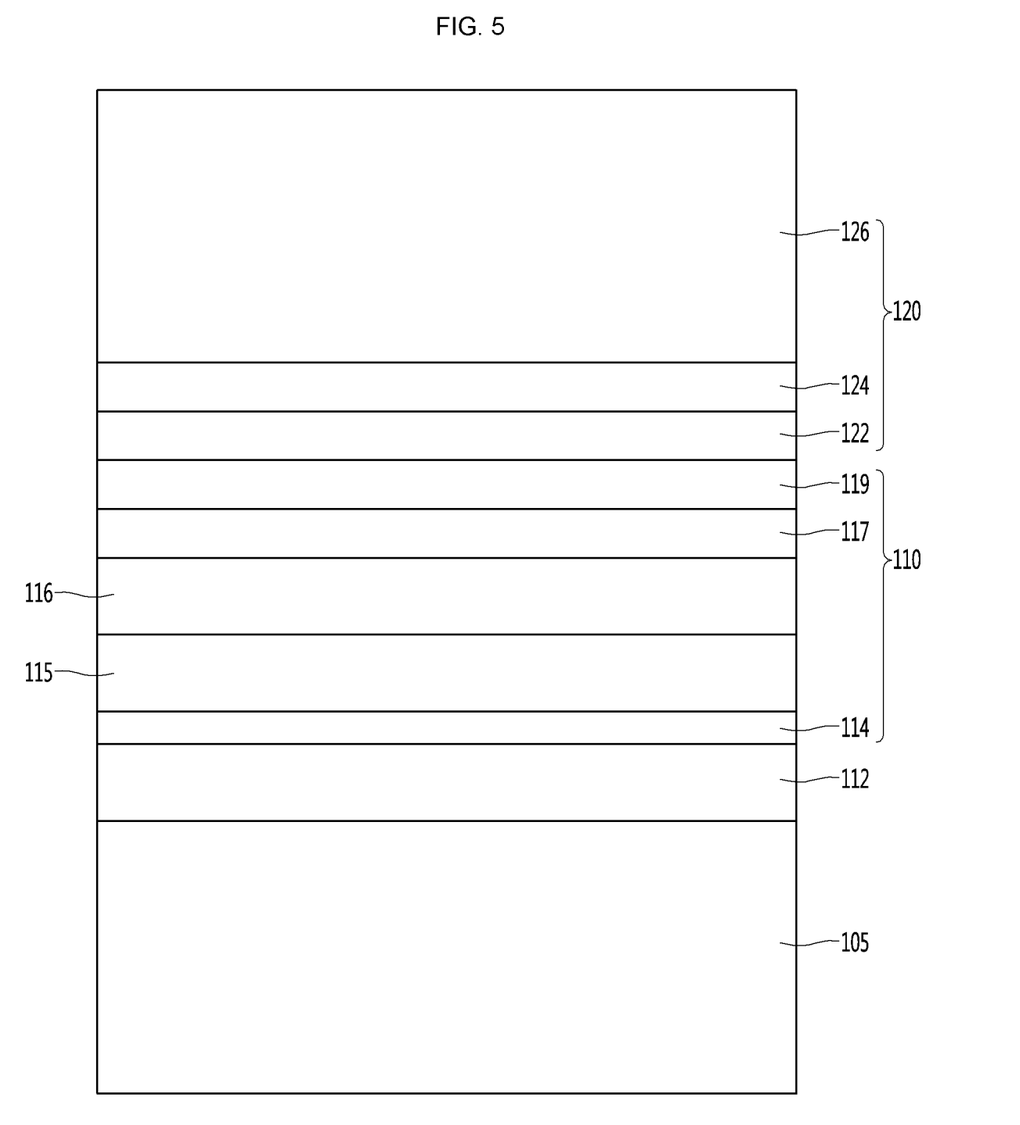

Then, as shown in FIG. 5, an active layer 117 and a second conductive type AlGaN-based semiconductor layer 119 may be formed on the first conductive type second AlGaN-based semiconductor layer 116.

The active layer 117 may be formed in at least one of a single quantum well structure, a multi-quantum well (MQW) structure, a quantum-wire structure, and a quantum dot structure.

For example, the active layer 117 may be formed in the MQW structure by injecting trimethylgallium gas (TMGa), ammonia gas (NH3), nitrogen gas (N2), and trimethylindium gas (TMIn), but is not limited thereto.

The active layer 117 may include a quantum well and a quantum wall. For example, the active layer 117 may be formed in one or more pair structures among AlGaN/GaN, AlGaN/AlGaN, InGaN/GaN, InGaN/InGaN, InAlGaN/

GaN, GaAs/AlGaAs, InGaAs/AlGaAs, GaP/AlGaP, and InGaP/AlGaP, but is not limited thereto.

The second conductive type AlGaN-based semiconductor layer 119 may be implemented as a semiconductor compound, for example, a compound semiconductor such as Group III-V, Group II-VI, or the like, and a second conductive type dopant may be doped thereon.

For example, the second conductive type AlGaN-based semiconductor layer 119 may include a semiconductor material having an empirical formula of $Al_qGa_{1-q}N$ ($0 \leq q \leq 1$). When the second conductive type AlGaN-based semiconductor layer 119 is a p-type semiconductor layer, the second conductive type dopant may include Mg, Zn, Ca, Sr, Ba, etc. as a p-type dopant.

In an embodiment, the first conductive type second AlGaN-based semiconductor layer 116 may be implemented as an n-type semiconductor layer, and the second conductive type AlGaN-based semiconductor layer 119 may be implemented as a p-type semiconductor layer, but is not limited thereto.

In addition, a semiconductor, for example, an n-type semiconductor layer (not shown) having polarity opposite to that of the second conductive type may be formed on the second conductive type AlGaN-based semiconductor layer 119. Accordingly, the light-emitting structure layer 110 may be implemented as any one structure of an n-p junction structure, a p-n junction structure, an n-p-n junction structure, and a p-n-p junction structure.

Then, a second electrode layer 120 may be formed on the second conductive type AlGaN-based semiconductor layer 119. The second electrode layer 120 may be formed of a contact layer 122, a reflective layer 124, and a conductive support member 126.

The contact layer 122 may be formed by stacking a single metal, a metal alloy, a metal oxide, or the like in multiple layers so as to efficiently perform carrier injection. For example, the contact layer 122 may be formed of a material having an excellent electrical contact with a semiconductor.

For example, the contact layer 122 may be formed to include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, but is not limited thereto.

A reflective layer 124 may be formed on the contact layer 122. The reflective layer 124 may be formed of a material having excellent reflectivity and excellent electrical contact. For example, the reflective layer 124 may be formed of a metal or an alloy thereof including at least one of Ag, Ni, Al, Rh, Pd, Ir, Ru, Mg, Zn, Pt, Au, and Hf.

In addition, the reflective layer 124 may be formed in multiple layers by using the metal or alloy and a light-transmitting conductive material such as IZO, IZTO, IAZO, IGZO, IGTO, AZO, or ATO, and for example, may be stacked with IZO/Ni, AZO/Ag, IZO/Ag/Ni, AZO/Ag/Ni, ITO/Ni, ITO/Ag, IT/Ag/Ni or the like.

Then, a conductive support member 126 may be formed on the reflective layer 124.

The conductive support member 126 may be formed of a metal, a metal alloy, or a conductive semiconductor material having excellent electrical conductivity so that carriers may be efficiently injected. For example, the conductive support member 126 may selectively include copper (Cu), gold (Au), a copper alloy (Cu Alloy), nickel (Ni), copper-tungsten (Cu—W), carrier wafers (e.g., GaN, Si, Ge, GaAs, ZnO, SiGe, SiC, etc.) or the like.

As a method of forming the conductive support member 126, an electrochemical metal deposition method or a bonding method using a eutectic metal, or the like may be used.

Figure 6:
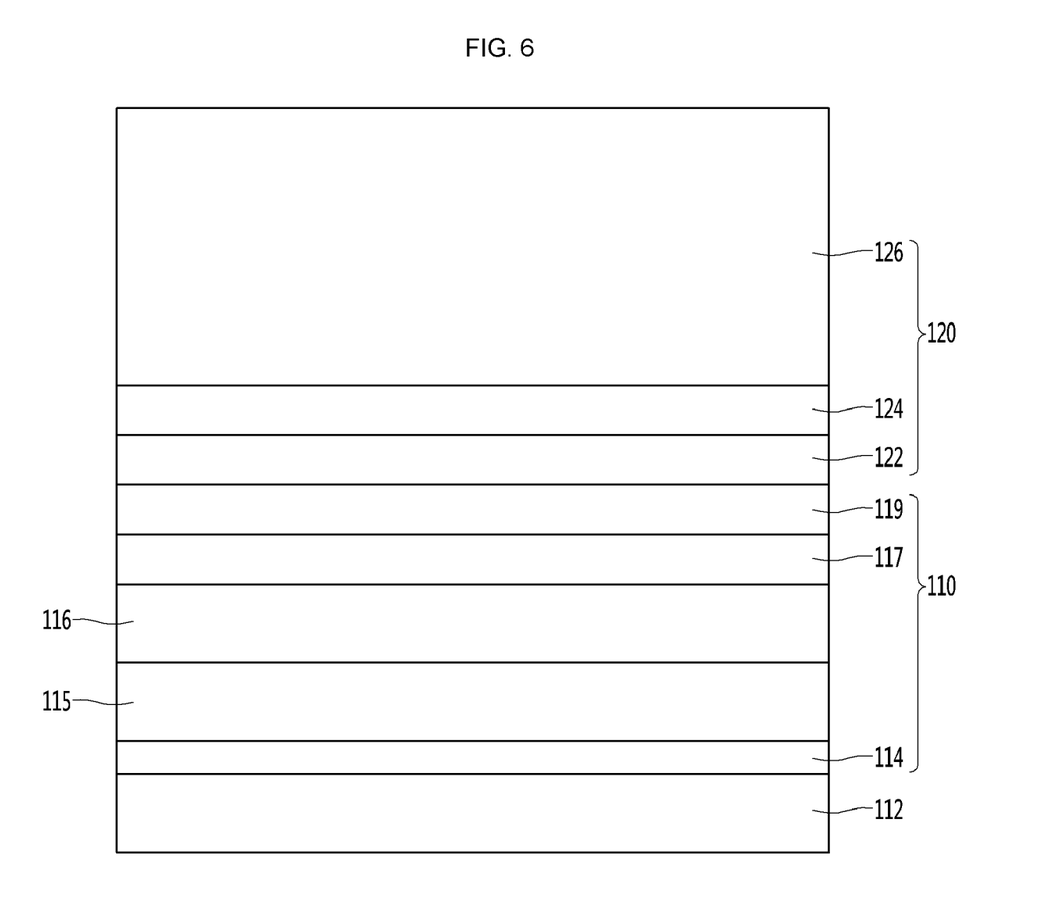

Then, the substrate 105 may be removed from the light-emitting structure layer 110 as shown in FIG. 6. For example, as a method of removing the substrate 105, separating the substrate by using a high-power laser or a chemical etching method may be used. In addition, the substrate 105 may be removed by physically grinding.

For example, in the laser lift-off method, when predetermined energy is applied at room temperature, energy is absorbed at an interface between the substrate 105 and the light-emitting structure layer, so that a bonding surface of the light-emitting structure layer is thermally decomposed, and thus the substrate 105 may be separated from the light-emitting structure layer.

Figure 7:
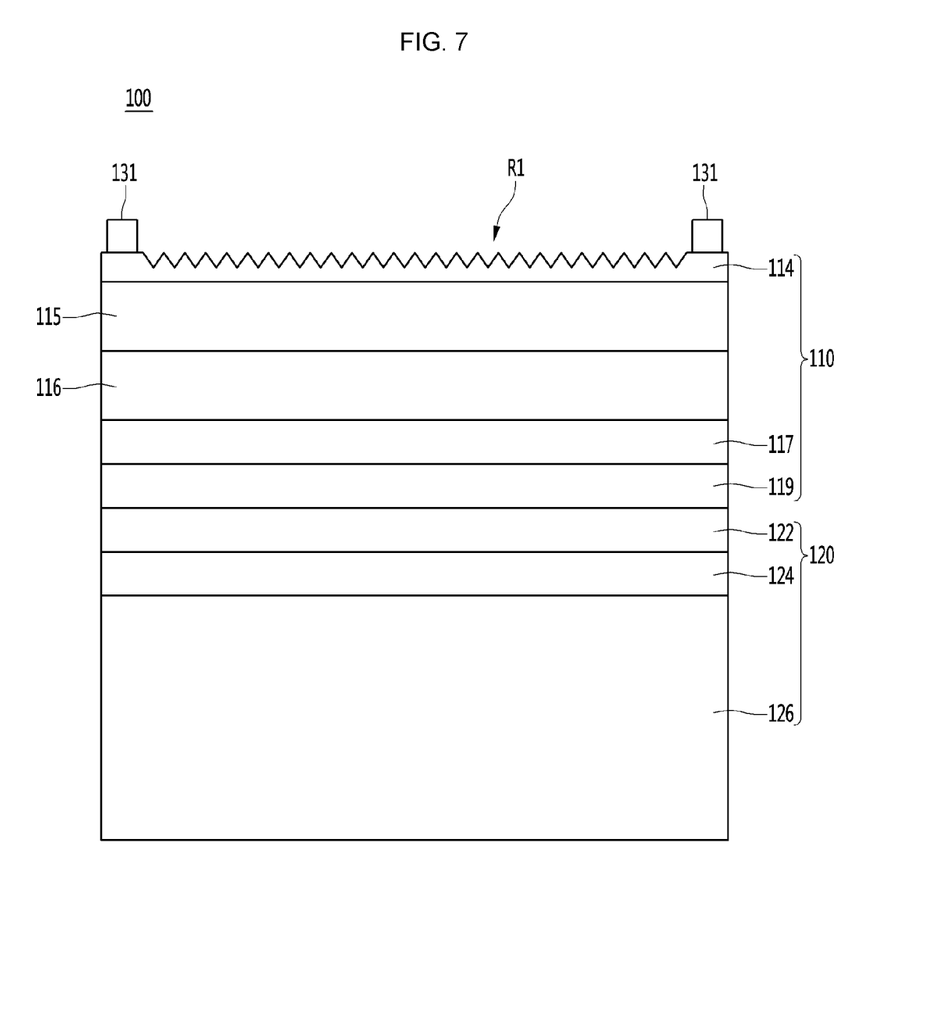

Then, as shown in FIG. 7, the first conductive type AlGaN-based semiconductor layer 114 may be exposed by removing the first conductive type semiconductor layer 112 by wet or dry etching, etc. And then, a first light extraction pattern R1 may be formed on the first conductive type AlGaN-based semiconductor layer 114, and the first light extraction pattern R1 may be a regular pattern, an irregular pattern, or a mixture thereof, but is not limited thereto.

In an embodiment, the first light extraction pattern R1 may have a predetermined horizontal width on the first conductive type AlGaN-based semiconductor layer 114 and may be formed of the same material as that of the first conductive type AlGaN-based semiconductor layer 114.

Then, a first electrode 131 may be formed on the first conductive type AlGaN-based semiconductor layer 114, thereby manufacturing an ultraviolet light-emitting diode according to the embodiment. For example, the first electrode 131 may be formed of a metal or an alloy including at least one of Ni, Al, Rh, Pd, Ir, Ru, Mg, Zn, Pt, Au, and Hf.

An embodiment may provide an ultraviolet light-emitting diode in which deterioration of crystal quality due to a difference in lattice constant is not caused even though an AlGaN layer is provided, and thus a high concentration of an n-type dopant is ensured and internal light-emitting efficiency is improved, a method of manufacturing a light-emitting diode, a light-emitting diode package, and a lighting system.

An embodiment may provide an ultraviolet light-emitting diode in which internal light-emitting efficiency may be remarkably improved by solving a problem of electron overflow and simultaneously minimizing a difference in lattice constant with an active layer, a method of manufacturing a light-emitting diode, a light-emitting diode package, and a lighting system.

In addition, an embodiment may provide an ultraviolet light-emitting diode in which current injection efficiency due to current spreading is improved while maintaining external light extraction efficiency by adopting a conventional electrode structure, and thus light output Po is remarkably improved, a method of manufacturing a light-emitting diode, a light-emitting diode package, and a lighting system.

An ultraviolet light-emitting diode are classified into UV-A (315 to 400 nm), UV-B (280 to 315 nm) and UV-C (200 to 280 nm) in a descending order of wavelength.

In an ultraviolet light-emitting diode (UV LED) according to an embodiment, according to the wavelength, the UV-A (315 to 400 nm) region may be applied to various fields such as industrial UV curing, printing ink curing, exposure apparatus, counterfeit detection, photocatalytic sterilization, special lighting (aquarium/agricultural) and the like, the UV-B (280 to 315 nm) region may be used for medical applications, and the UV-C (200 to 280 nm) region may be applied to air purification, water purification, sterilization products, or the like.

A light-emitting diode according to an embodiment may be arrayed in plural on a substrate in the form of a package, and a light guide plate, a prism sheet, a spreading sheet, a fluorescent sheet, or the like, which is an optical member, may be disposed on a path of light emitted from the light-emitting diode package.

The light-emitting diode according to the embodiment may be applied to a backlight unit, a lighting unit, a display device, an indicating device, a lamp, a streetlight, a vehicle lighting device, a vehicle display device, a smart watch, or the like, but is not limited thereto.

Figure 8:
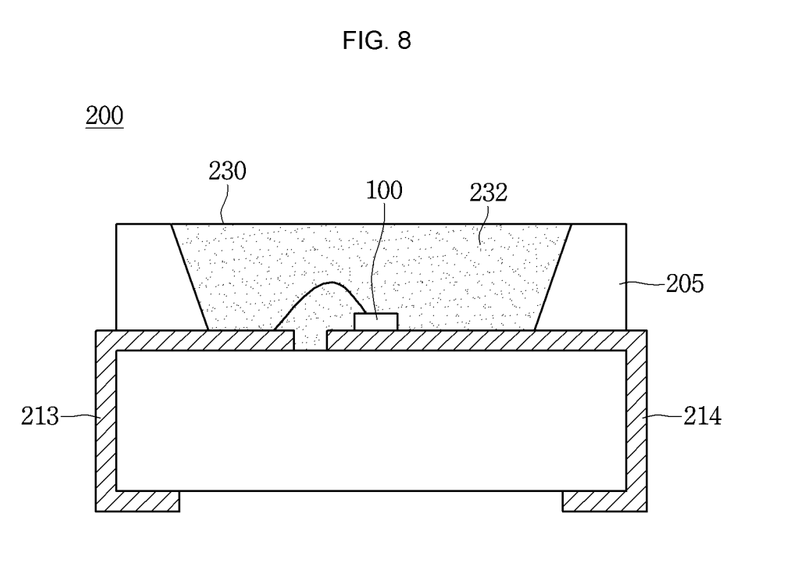
FIG. 8 is a cross-sectional view of a light-emitting diode package according to an embodiment.

For example, FIG. 8 is a view explaining a light-emitting diode package 200 on which a light-emitting diode according to embodiments is installed.

The light-emitting diode package according to an embodiment includes a package body 205, a third electrode layer 213 and a fourth electrode layer 214 installed on the package body 205, a light-emitting diode 100 installed on the package body 205 and electrically connected to the third electrode layer 213 and the fourth electrode layer 214, and a molding member 230 surrounding the light-emitting diode 100, The third electrode layer 213 and the fourth electrode layer 214 are electrically separated from each other and serves a function to provide power to the light-emitting diode 100. In addition, the third electrode layer 213 and the fourth electrode layer 214 may serve a function to increase luminous efficiency by reflecting light generated from the light-emitting diode 100 and may also serve a function to discharge heat generated from the light-emitting diode 100 to an outside.

The light-emitting diode 100 may be electrically connected with the third electrode layer 213 and/or the fourth electrode layer 214 in one of a wire method, a flip chip method and a die bonding method.

The light-emitting diode 100 may be an ultraviolet light-emitting diode according to a first embodiment but is not limited thereto, and may include a light-emitting diode 102 according to a second embodiment.

The molding member 230 may include a phosphor 232 to form a light-emitting diode package of white light, but is not limited thereto.

Figure 9:
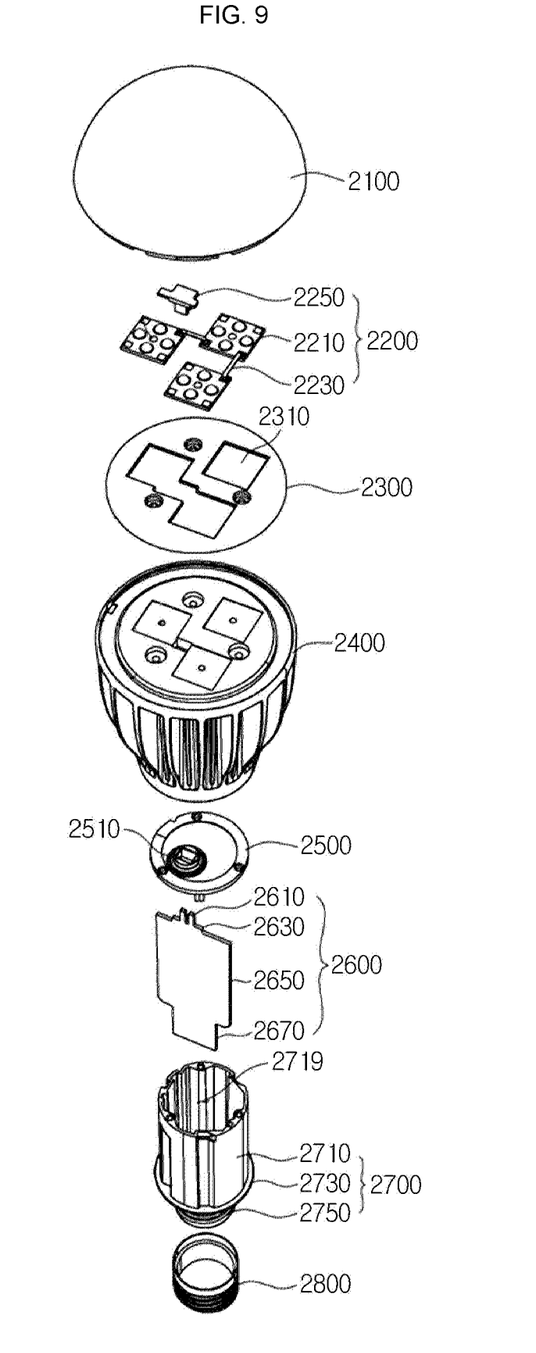
FIG. 9 is a perspective view of a lighting system according to an embodiment.

FIG. 9 is an exploded perspective view illustrating a lighting system according to an embodiment.

The lighting system according to an embodiment may include a cover 2100, a light source module 2200, a heat sink 2400, a power supply 2600, an inner case 2700 and a socket 2800. In addition, the lighting system according to an embodiment may further include at least one of a member 2300 and a holder 2500. The light source module 2200 may include a light-emitting diode or a light-emitting diode package according to an embodiment.

The light source module 2200 may include a light source part 2210, a connection plate 2230 and a connector 2250. The member 2300 may be disposed on an upper surface of the heat sink 2400 and may have a plurality of light source parts 2210 and guide grooves 2310 into which the connector 2250 is inserted.

The holder 2500 blocks an accommodating groove 2719 of an insulation part 2710 of the inner case 2700. Therefore, the power supply 2600 accommodated in the insulation part 2710 of the inner case 2700 is blocked. The holder 2500 has a guide protrusion part 2510.

The power supply 2600 may include a protrusion part 2610, a guide part 2630, a base 2650 and an extension part 2670. The inner case 2700 may include a molding part together with the power supply 2600 therein. The molding part is a portion formed by hardening a molding liquid and allows the power supply 2600 to be fixed into the inner case 2700.

The characteristics, structures and effects described in the above-described embodiments are included in at least one embodiment but are not limited to one embodiment. Further, the characteristic, structure, and effect illustrated in each embodiment may be combined or modified for other embodiments by a person skilled in the art. Therefore, it would be construed that contents related to such a combination and such a modification are included in the scope of the present invention.

Embodiments are mostly described above. However, they are only examples and do not limit the present invention. A person skilled in the art may appreciate that several variations and applications not presented above may be made without departing from the essential characteristic of the embodiments. For example, each component particularly represented in embodiments may be varied. In addition, it should be construed that differences related to such a variation and such an application are included in the scope of the present invention defined in the following claims.

INDUSTRIAL APPLICABILITY

The present invention may be applied to a light-emitting diode, a display device, and a lighting system industry.

The invention claimed is:

1. A light-emitting diode comprising:
a conductive substrate;
a second conductive type semiconductor layer disposed on the conductive substrate;
an active layer disposed on the second conductive type semiconductor layer;
an InAlGaN-based strain relieving layer disposed on the active layer;
a current spreading layer disposed on the InAlGaN-based strain relieving layer; and
a first conductive type semiconductor layer disposed on the current spreading layer,
wherein the first conductive type semiconductor layer, the second conductive type semiconductor layer and the active layer include Al, separately, and
the current spreading layer includes a first conductive type $Al_xGa_{1-x}N$ layer,
wherein a composition x of Al in the first conductive type $Al_xGa_{1-x}N$ layer is reduced in a direction of the active layer from a region adjacent to the first conductive type semiconductor layer, and
a ratio of the composition Al to a composition Ga in the first conductive type $Al_xGa_{1-x}N$ layer is 1:3 or less,
wherein the current spreading layer further includes:
an AlN-based semiconductor layer on the first conductive type $Al_xGa_{1-x}N$ layer; and
a GaN-based semiconductor layer on the AlN-based semiconductor layer,
wherein the InAlGaN-based strain relieving layer includes:
an InGaN-based semiconductor layer disposed under the current spreading layer; and an AlGaN-based semiconductor layer disposed under the InGaN-based semiconductor layer, wherein a thickness of the AlN-based semiconductor layer is 1 to 3 nm, a thickness of the GaN-based semiconductor layer is 1 to 20 nm, and a thickness of the first conductive type $Al_xGa_{1-x}N$ layer is 1 to 20 nm, wherein the first conductive type $Al_xGa_{1-x}N$ layer includes an n-type dopant of $2\times10^{19}$ to $3\times10^{19}$ (atoms/cm$^3$), wherein the active layer comprise indium, wherein the InGaN-based semiconductor layer includes an undoped InGaN layer or InAlGaN layer, wherein the AlGaN-based semiconductor layer includes an n-type dopant of $5\times10^{17}$ to $1\times10^{19}$ (atoms/cm$^3$), wherein the first conductive type $Al_xGa_{1-x}N$ layer is spaced apart from the AlGaN-based semiconductor layer and directly makes contact with the InGaN-based semiconductor layer.

2. The light-emitting diode of claim 1, wherein a thickness of the InGaN-based semiconductor layer or the AlGaN-based semiconductor layer is 1 to 10 nm, respectively.

3. The light-emitting diode of claim 1, comprising a first electrode disposed on the first conductive type semiconductor layer.

4. The light-emitting diode of claim 3, comprising a light extraction pattern on an upper surface of the first conductive type semiconductor layer.

5. The light-emitting diode of claim 4, wherein the first electrode is disposed on an edge of the upper surface of the first conductive type semiconductor layer.

6. The light-emitting diode of claim 5, wherein the light extraction pattern is not formed on an upper surface of the first conductive type semiconductor layer disposed on a lower surface of the first electrode.

7. The light-emitting diode of claim 6, wherein the first electrode is formed of a metal or an alloy including at least one of Ni, Al, Rh, Pd, Ir, Ru, Mg, Zn, Pt, Au, and Hf.

8. The light-emitting diode of claim 1, comprising a contact layer and a reflective layer disposed between the conductive substrate and the second conductive type semiconductor layer.

9. The light-emitting diode of claim 8, wherein the contact layer is in contact with the second conductive type semiconductor layer.

10. The light-emitting diode of claim 8, wherein the reflective layer is disposed by stacking ITO/Ni, ITO/Ag, and ITO/Ag/Ni.

11. The light-emitting diode of claim 1, wherein the conductive substrate selectively includes copper (Cu), gold (Au), a copper alloy (Cu Alloy), nickel (Ni), copper-tungsten (Cu—W), and a carrier wafer.

12. The light-emitting diode of claim 1, wherein the composition x of Al of the first conductive type $Al_xGa_{1-x}N$ layer includes $0<x\leq0.25$.

13. The light-emitting diode of claim 1, wherein a wavelength of light having the strongest intensity of light emitted from the light-emitting diode includes 440 nm to 485 nm.

\* \* \* \* \*

UNITED STATES PATENT AND TRADEMARK OFFICE
CERTIFICATE OF CORRECTION

PATENT NO. : 10,816,143 B2
APPLICATION NO. : 16/074416
DATED : October 27, 2020
INVENTOR(S) : Hyun Chul Lim and Jae Woong Han Page 1 of 1

It is certified that error appears in the above-identified patent and that said Letters Patent is hereby corrected as shown below:

On the Title Page

Item (72), should read:
(72) Inventors: Hyun Chul Lim, Seoul (KR); Jae Woong Han, Seoul (KR)

Signed and Sealed this
Fifteenth Day of December, 2020

Andrei Iancu
*Director of the United States Patent and Trademark Office*